United States Patent [19]
Etters et al.

[11] Patent Number: 6,077,124
[45] Date of Patent: Jun. 20, 2000

[54] ELECTRICAL CONNECTORS FOR FLAT FLEXIBLE CIRCUITRY WITH YIELDABLE BACKING STRUCTURE

[75] Inventors: Harry N. Etters, Plainfield; Robert M. Fuerst, Maple Park; Russell J. Watt, Chicago, all of Ill.

[73] Assignee: Molex Incorporated, Lisle, Ill.

[21] Appl. No.: 08/948,830

[22] Filed: Oct. 10, 1997

[51] Int. Cl.[7] .................................................. H01L 24/00
[52] U.S. Cl. .......................................... 439/632; 439/496
[58] Field of Search .............................. 439/632, 67, 493, 439/495, 496

[56] References Cited

U.S. PATENT DOCUMENTS

| | | | |
|---|---|---|---|
| 3,319,216 | 5/1967 | McCullough | 439/493 |
| 3,602,870 | 8/1971 | Willard | 439/74 |
| 3,825,878 | 7/1974 | Finger et al. | 439/493 |
| 4,802,866 | 2/1989 | Balzano et al. | 439/496 |
| 5,383,788 | 1/1995 | Spencer | 439/67 |
| 5,529,502 | 6/1996 | Peltier et al. | 439/67 |

*Primary Examiner*—Steven L. Stephan
*Assistant Examiner*—Barry M. L. Standig
*Attorney, Agent, or Firm*—Stacey E. Caldwell

[57] ABSTRACT

A female connector is adapted for electrically interconnecting the conductors of a flat flexible circuit to the conductors of a complementary mating connecting device. The connector includes a female housing having wall portions defining a cavity for receiving the flexible circuit. The wall portions are relatively movable between an open condition allowing a yieldable backing structure to be assembled on a cavity-side of at least one of the wall portions and a closed condition defining the cavity. The yieldable backing structure resiliently biases the conductors of the flexible circuit received in the cavity against the conductors of the mating connecting device when the connector is mated with the device.

27 Claims, 12 Drawing Sheets

FIG. II

ELECTRICAL CONNECTORS FOR FLAT FLEXIBLE CIRCUITRY WITH YIELDABLE BACKING STRUCTURE

FIELD OF THE INVENTION

This invention generally relates to the art of electrical connectors and, particularly, to connectors for electrically interconnecting flat flexible circuitry.

BACKGROUND OF THE INVENTION

A flat flexible circuit conventionally includes an elongated flat flexible dielectric substrate having laterally spaced strips of conductors on one or both sides thereof. The conductors may be covered with a thin, flexible protective layer on one or both sides of the circuit. If protective layers are used, openings are formed therein to expose the underlying conductors at desired contact locations where the conductors are to engage the conductors of a complementary mating connecting device which may be a second flat flexible circuit, a printed circuit board or the terminals of a mating connector.

A wide variety of connectors have been designed over the years for terminating or interconnecting flat flexible circuits with complementary mating connecting devices. Problems continue to plague such connectors, particularly in the area of cost, complexity and reliability. Not only is the direct material costs of such connectors relatively high, but an undue amount of labor time is required in assembling such connectors. Furthermore, each connector is designed and manufactured to accommodate a particular flex circuit size and therefore for each size a single connector must be designed, manufactured and inventoried. In addition, the cost and time associated with application tooling for the connectors and their flexible circuits also adds to the problems associated with such connectors. The present invention is directed to solving these problems by providing simple, inexpensive and reliable connector structures not heretofore available.

SUMMARY OF THE INVENTION

An object, therefore, of the invention is to provide a new and improved connector for flat flexible circuitry.

Another object of the invention is to provide a new and improved female connector for electrically interconnecting the conductors of a flat flexible circuit to the conductors of a complementary mating connecting device.

Generally, the connector of the invention includes a female housing having wall means defining a cavity for receiving the flexible circuit. The wall means include wall portions which are relatively movable between an open condition allowing a yieldable backing structure to be assembled on a cavity-side of at least one of the wall portions, and a closed condition defining the cavity. A yieldable backing structure is provided on the cavity-side of the one wall portion for resiliently biasing the conductors of the flexible circuit received in the cavity against the conductors of the mating connecting device when the connector is mated with the device.

As disclosed herein, the female housing is molded of plastic material and the relatively movable wall means are joined by an integrally molded living hinge. The yieldable backing structure may be a separate component assembled to the wall portion when the wall means are in the open condition. The yieldable backing structure may be a molded-in-place component fabricated with the wall means in the open condition.

In the exemplary embodiment of the invention, the female housing is generally U-shaped and includes a pair of side wall portions defining opposite sides of the cavity and a rear wall portion defining a rear of the cavity. One of the yieldable backing structures is provided on the cavity-side of each of the side wall portions. A slot may be provided in the rear wall portion through which the flat flexible circuit is positioned. The invention also contemplates that the female housing be surrounded by a generally rigid shell having an opening aligned with the cavity in the housing.

In an alternate embodiment of the invention, the housing includes end wall portions cooperating with the side wall portions and the rear wall portion to define a box-like structure with a front opening for receiving the flexible circuit. Latch means are operatively associated between at least some of the wall portions to hold all the wall portions in their box-like configuration. In this embodiment, the rigid outer shell may be eliminated.

The invention contemplates that a single size connector can accommodate a range of flex circuit conductor designs within the same size flex circuit inasmuch as individual terminals are eliminated. Furthermore, since the connector does not use terminals, the costs and time associated with application tooling is completely eliminated.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

DETAILED DESCRIPTION OF THE PREFERRED EMBODIMENT

Figure 1:
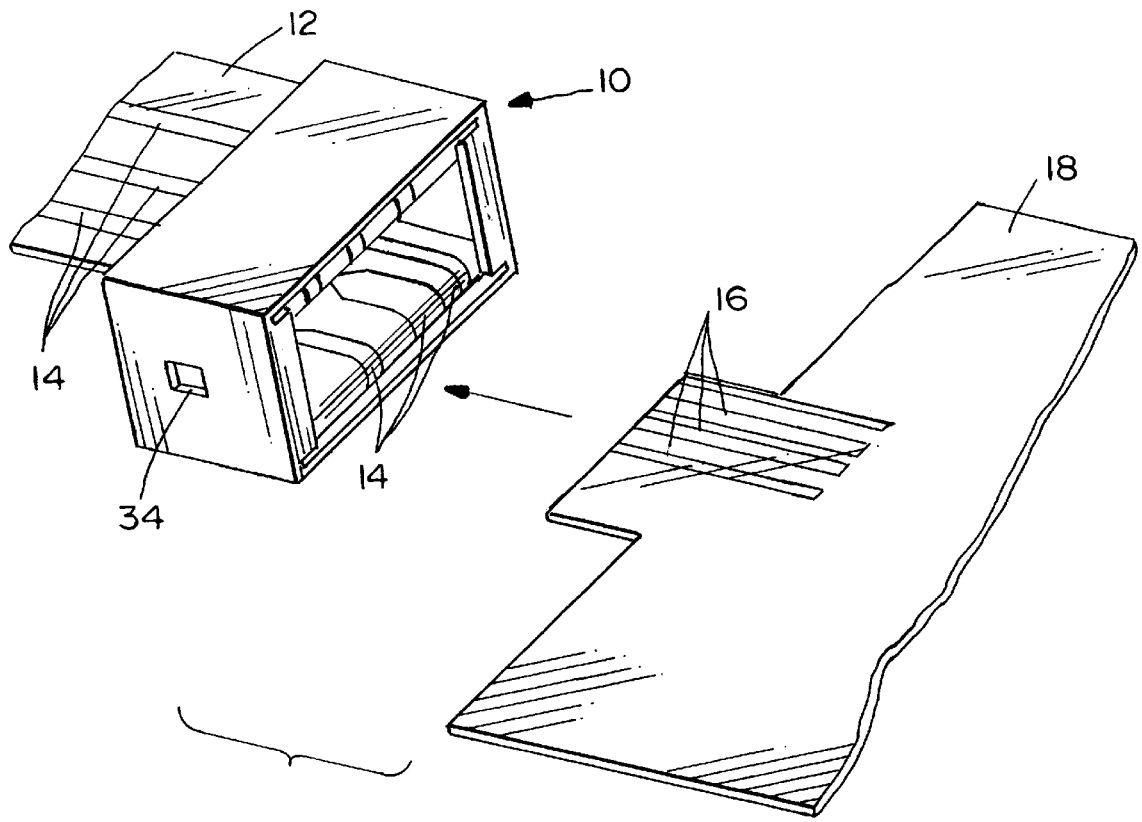
FIG. 1 is a perspective view of a female connector terminating a flat flexible circuit, according to the invention, along with a printed circuit board mateable with the connector.

Referring to the drawings in greater detail, the concepts of the invention are disclosed herein as embodied in a connector assembly, including a female connector and a male connector. Various embodiments of the female connector are shown in FIGS. 1–10. Various embodiments of the male connector are shown in FIGS. 11–19. It should be understood that the female connector can be mated with the male connector as a connector assembly, or either the female connector or the male connector can be used alone for electrically interconnecting the conductors of a flat flexible circuit to the conductors of a variety of other complementary mating connecting devices.

For instance, FIG. 1 shows a female connector, generally designated 10, for terminating a flat flexible circuit 12 and electrically interconnecting the conductors 14 of the flexible circuit to conductors or circuit pads 16 on one or both sides of a rigid printed circuit board 18.

Figure 2:
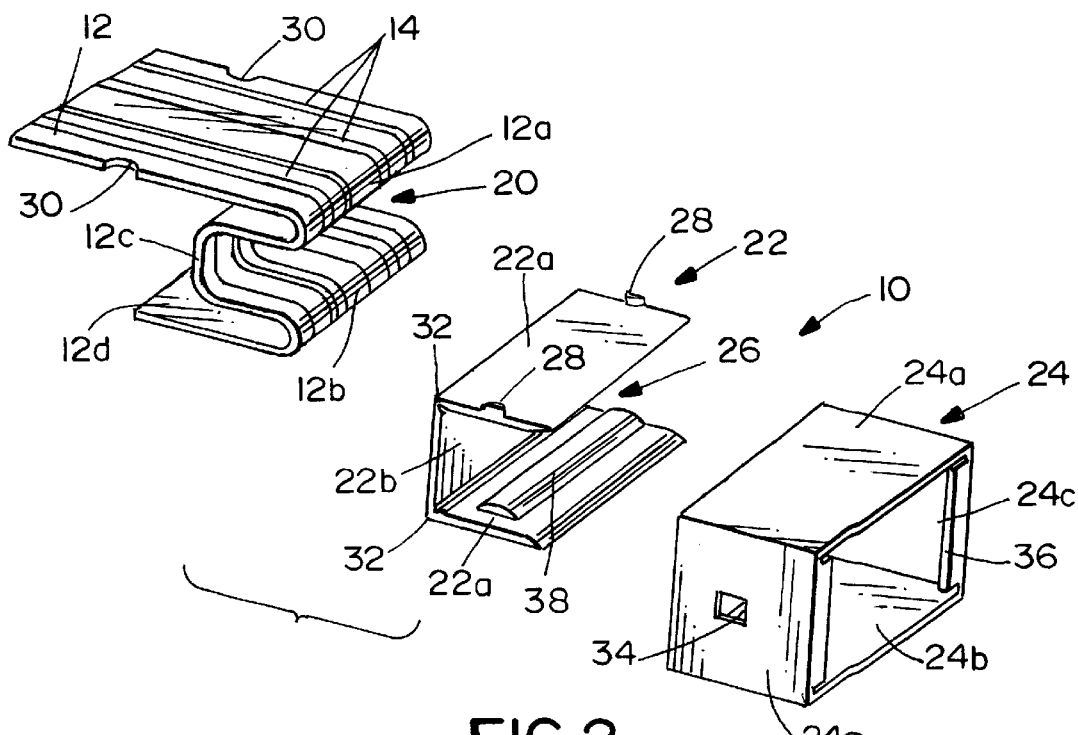
FIG. 2 is an exploded perspective view of the female connector and flat flexible circuit.

FIG. 2 shows female connector 10 in conjunction with the flat flexible circuit 12 which has been folded for assembly purposes. For reference or nomenclature purposes, the flexible circuit has been folded to include an upper front fold 12a and a lower front fold 12b between which the flexible circuit is folded into a generally U-shape to define a rear fold 12c. This configuration defines a mouth, generally designated 20. The distal end 12d of the flexible circuit is folded in a rearward direction, as shown.

Still referring to FIG. 2, female connector 10 includes a female housing, generally designated 22, and a box-like outer shell, generally designated 24. The female housing is generally U-shaped and includes a pair of side wall portions 22a defining opposite sides of a cavity, generally designated 26, along with a rear wall portion 22b which defines the rear of the cavity. The upper side wall portion includes a pair of tabs 28 at opposite edges thereof which seat into recesses 30 in opposite edges of flexible circuit 12 for properly locating the circuit relative to female housing 22 and to provide strain relief for the circuit. The female housing is a one-piece structure integrally molded of dielectric material such as plastic or the like. Side wall portions 22a are joined to rear wall portion 22b by integrally molded living hinges 32 which permit the wall portions of the female housing to be movable between an open condition and a closed condition, as described hereinafter.

Rigid outer shell 24 (FIG. 2) of female connector 10 also is a one-piece structure including top and bottom walls 24a and 24b, respectively, and a pair of opposite side walls 24c. The side walls are provided with latch openings 34 for purposes described hereinafter. The shell has a front opening 36 which is aligned with cavity 26 of female housing 22 when the connector is in assembled condition as shown in FIG. 1.

The invention contemplates that female housing 22 be provided with a yieldable backing structure 38 on the cavity-side of one or both of side wall portions 22a for resiliently biasing conductors 14 of flexible circuit 12 received in cavity 26 against the conductors of the mating connecting device (such as printed circuit board 18) when the connector is mated with the device. With flexible circuit 12 folded as shown in FIG. 2, upper front fold 12a will embrace top side wall portion 22a and lower front fold 12b will embrace lower side wall portion 22a, so both side wall portions will be provided with one of the yieldable backing structures 38. It can be seen in FIG. 2 that each yieldable backing structure is elongated in the direction of the width of the flexible circuit so that the backing structure is at least wide enough to resiliently bias all of the conductors 14 of the circuit against their respective conductors of the complementary mating connecting device. It can further be seen that the backing structure 38 is generally uniform in size and therefore can resiliently bias a flex circuit having any conductor configuration or thickness. That is to say, since there are no discrete terminals in the connector, the layout of the flex circuit and the positioning of the conductors thereon is not critical to the actual connector or connector size. Therefore, in applications such as high current applications where the conductor thickness may be larger than other, lower current applications, the connector configurations can remain the same.

Figure 3:
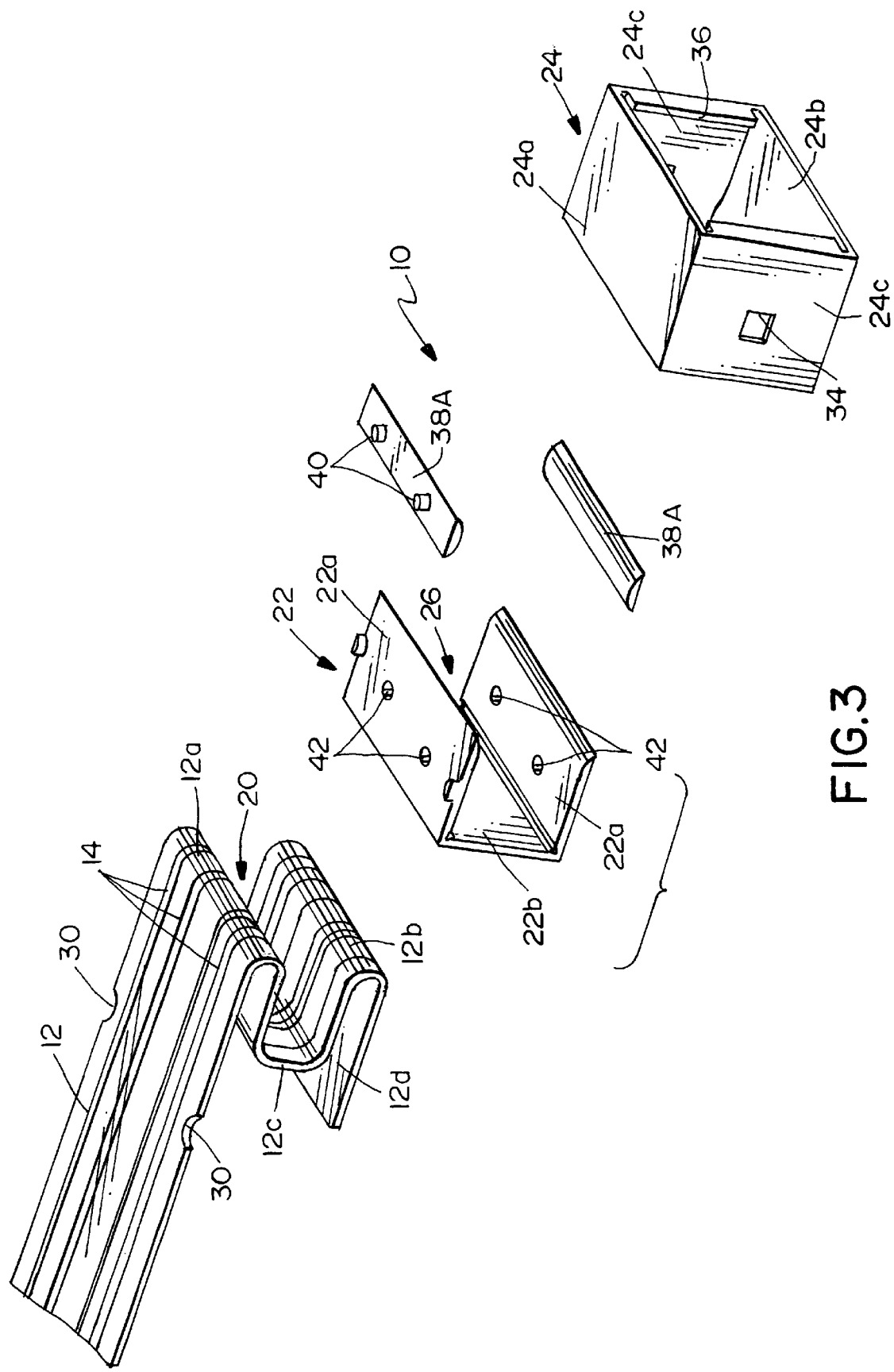
FIG. 3 is a view similar to that of FIG. 2, showing the yieldable backing structures as separate components.

FIG. 2 represents an embodiment of the invention wherein the yieldable backing structures 38 comprise molded-in-place components, as described below. FIG. 3 represents an embodiment wherein yieldable backing structure 38A are separately molded components secured in place by tabs 40 inserted into holes 42 in side wall portions 22a of the female housing. Adhesives may be used to further fix yieldable backing structures 38A in position. Whereas female housing 22 is molded of relatively stiff or rigid plastic material, yieldable backing structures 38 or 38A are molded or otherwise fabricated of elastomeric material such as silicone rubber or the like.

Figure 4:
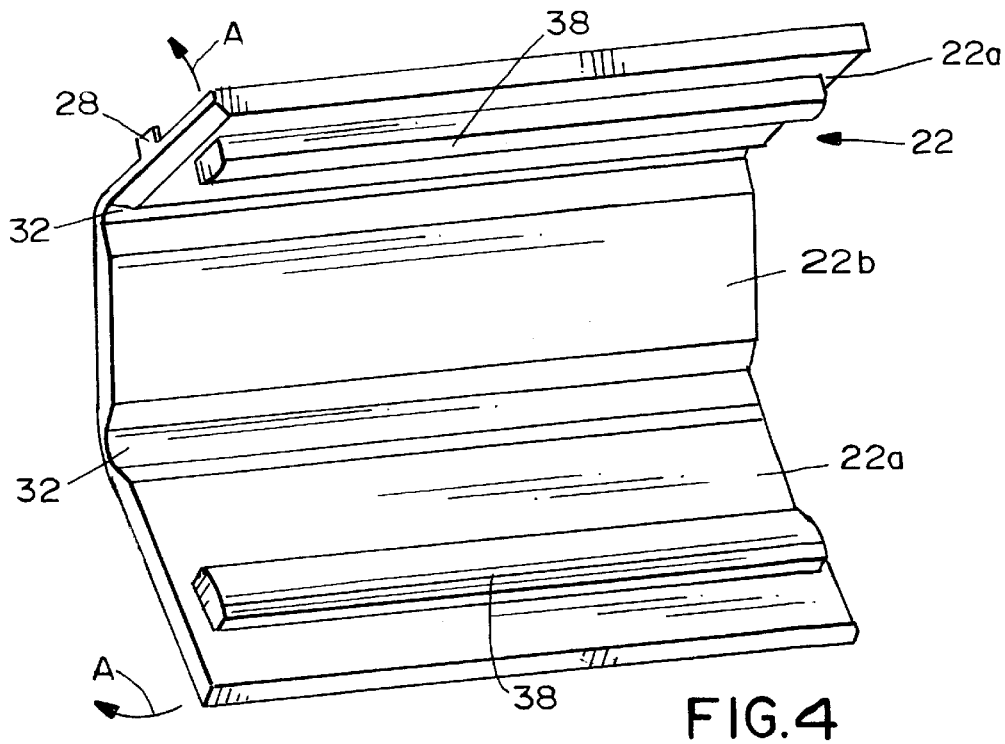
FIG. 4 is a perspective view of the female housing in a partially open condition.

FIG. 4 shows female housing 22 in a partially open condition in comparison to the closed U-shaped condition of FIG. 2. In particular, side wall portions 22a can be moved or rotated relative to rear wall portion 22b about living hinges 32 until the entire female housing is in a flat, fully open condition. In this condition, yieldable backing structures 38 can be very easily assembled or fabricated to the side wall portions, i.e. much easier than if the female housing was a rigid closed structure. With the embodiment of FIG. 3, yieldable backing structures 38A simply are positioned on the open side wall portions and fixed into place by way of heat staking, latching, ultrasonically welding or the like. In the embodiment of FIG. 2, yieldable backing structures 38 can easily be molded-in-place in elongated recesses in the side wall portions, with the side wall portions in their open, flat condition. The invention contemplates that the molded-in-place backing structures 38 can be insert molded into the recesses in the side wall portions. On the other hand, it is contemplated that the backing structures can be molded in a "two-shot" fabricating process wherein the plastic material of the female housing is injected in one shot, the silicone rubber of backing structures 38 is injected in a second shot, and the materials are cured sequentially, i.e., the plastic material is cured during the second shot injection.

Figure 5:
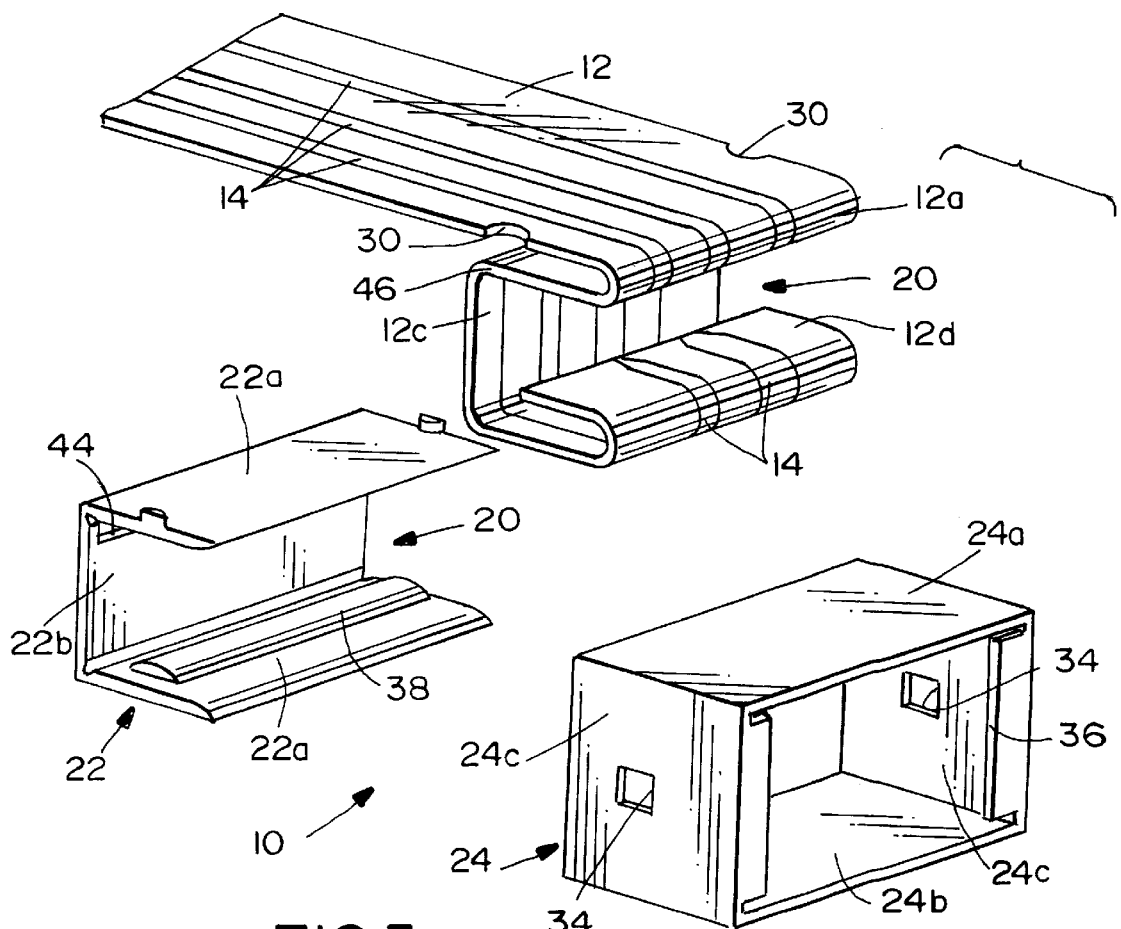
FIG. 5 is a view somewhat similar to that of FIG. 2, but with the connector adapted for terminating a double-sided flexible circuit.

FIG. 5 shows an embodiment very similar to that of FIG. 2, but an elongated slot 44 is formed in rear wall portion 22b of female housing 22 immediately below top side wall portion 22a. This slot enables the connector to be used with a flat flexible circuit 12 which is "double-sided". In other words, the circuit has conductors 14 on both sides thereof. In assembling the double-sided circuit to female housing 22 with slot 44, the circuit, as at 46, projects through slot 44 such that rear fold 12c of the circuit is disposed on the outside of rear wall portion 22b of the female housing. The flexible circuit then is folded around the outside of the bottom side wall 22a until distal end 12d of the circuit is disposed inside cavity 20 on top of the lower yieldable backing structure 38. Therefore, the conductors 14 on the underside of the circuit now face upwardly into the cavity, whereby the conductors on both sides of the circuit are engageable with the conductors on two sides of an appropriate complementary mating device.

Figure 6:
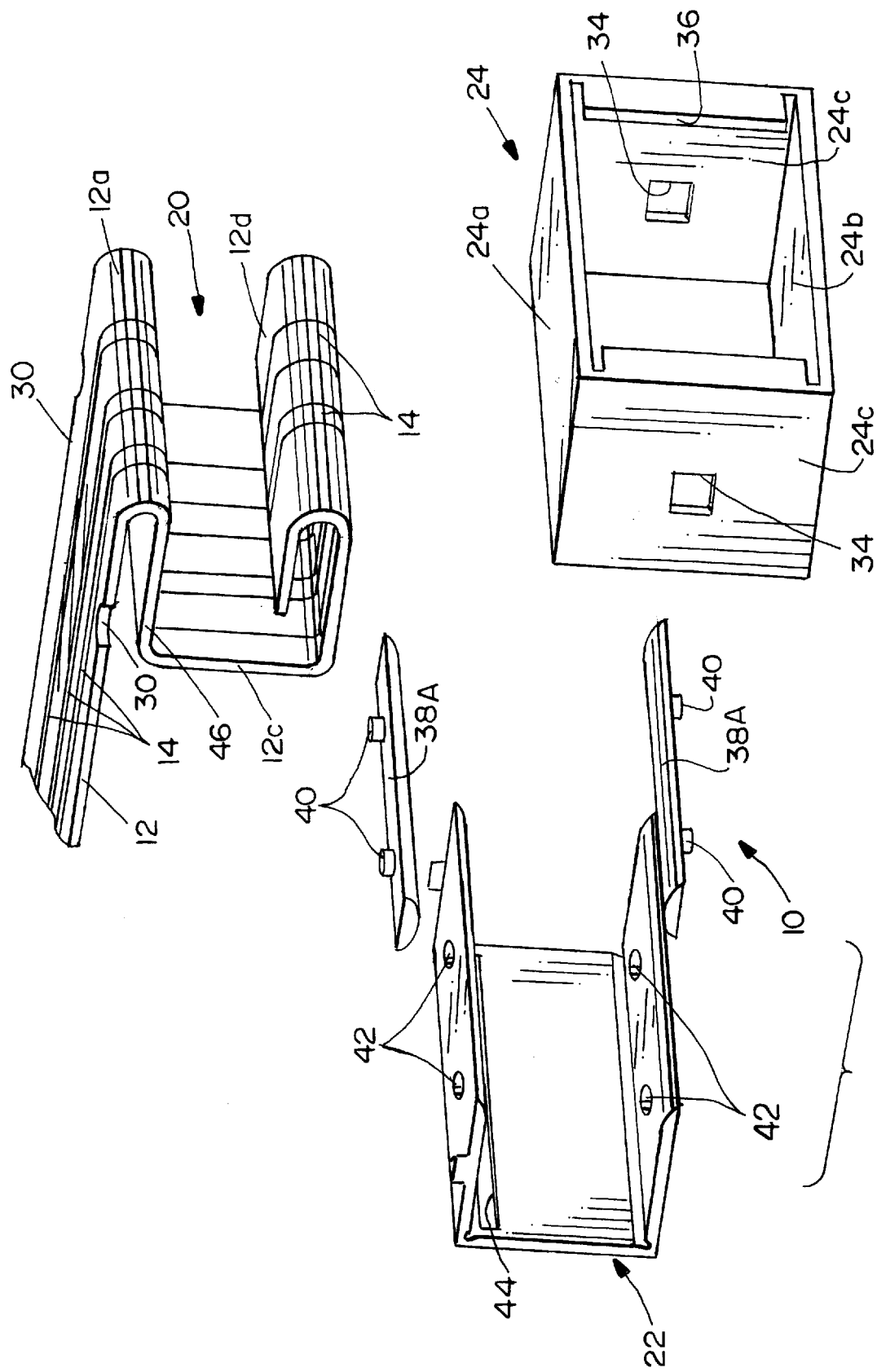
FIG. 6 is an exploded perspective view of the connector of FIG. 5, with the yieldable backing structures shown as separate components.

In the double-sided embodiment of FIG. 5, yieldable backing structures 38 are molded-in-place components, as described above. FIG. 6 shows substantially the same embodiment, but the yieldable backing structures 38A are mechanically fixed and glued in place as described above in relation to FIG. 3.

Figure 7:
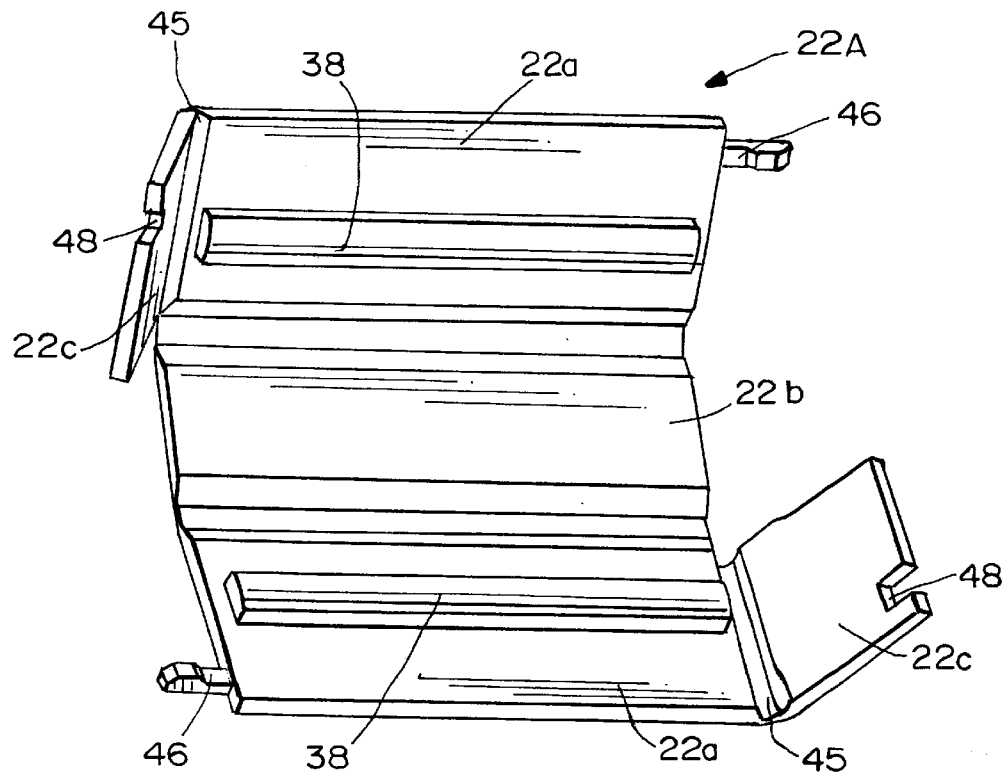
FIG. 7 is a perspective view of an alternate embodiment of a female housing in a substantially open condition.
Figure 8:
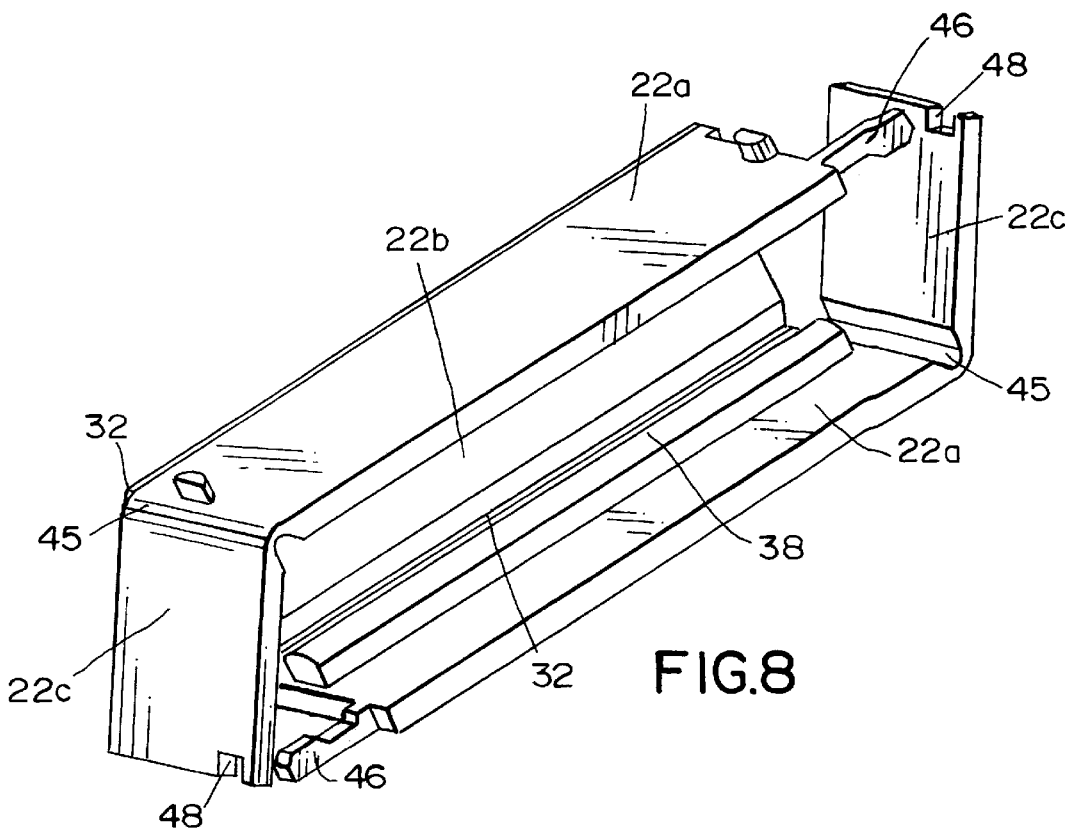
FIG. 8 is a perspective view of the female housing of FIG. 7 about to be closed and latched.

FIGS. 7 and 8 show an alternate embodiment of a female housing, generally designated 22A, which not only has opposite side wall portions 22a and rear wall portion 22b, but the housing construction of FIG. 7 includes a pair of opposite end wall portions 22c. The end wall portions are pivotally connected to the side wall portions by living hinges 45. The side wall portions have hooked latch arms 46 which latchingly engage within latch holes 48 in end wall portions 22c to hold the female housing construction in a closed box-like configuration. This construction can be used to eliminate outer shell 24. Yet, female housing 22A still can be fully opened to allow yieldable backing structures 38 (or 38A) to be assembled or molded-in-place on side wall portions 22a, whereafter the structure can be closed to define a cavity for receiving the folded flexible circuit.

Figure 9:
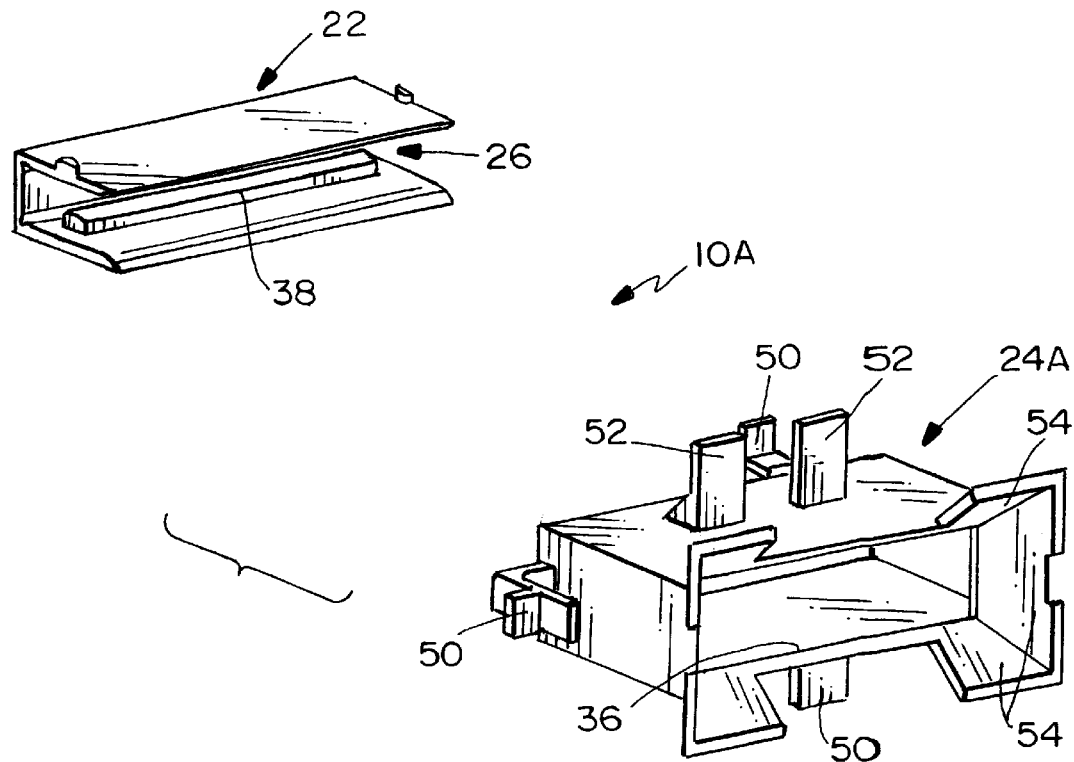
FIG. 9 is an exploded perspective view of an embodiment of the female connector adapted for mounting in a panel.
Figure 10:
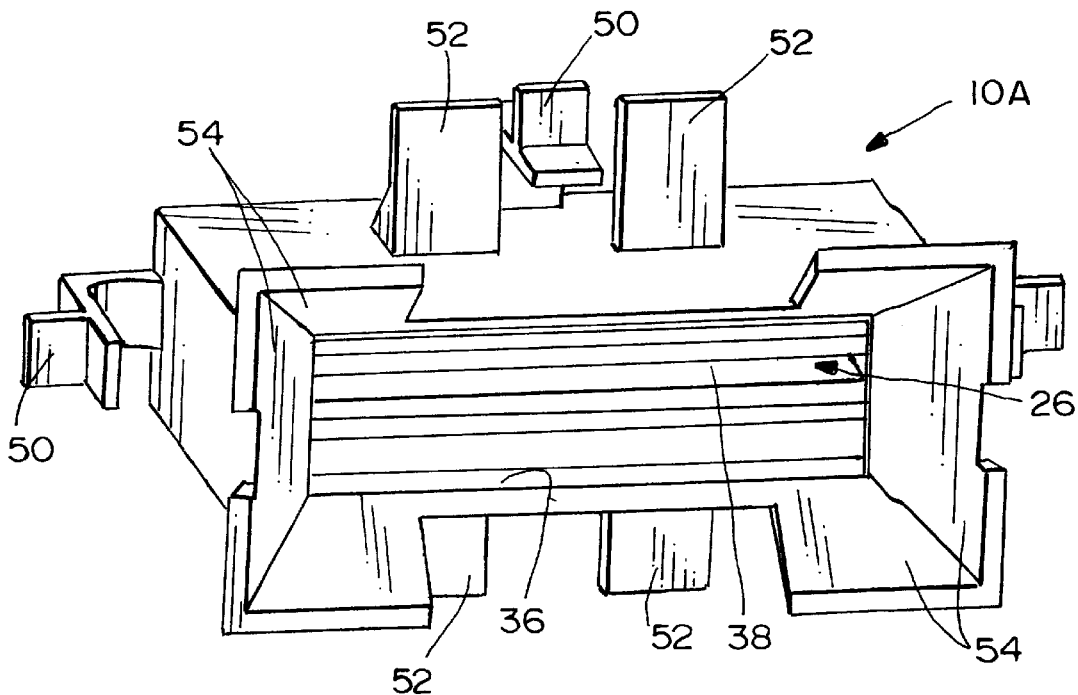
FIG. 10 is a perspective view of the connector of FIG. 9.

FIGS. 9 and 10 show an embodiment of a female connector, generally designated 10A, which is adapted for mounting in an opening in a panel. Female housing 22 is substantially identical to that described above. However, shell 24A include flexible arms 50 and rigid arms 52 for engaging opposite sides of a panel, with shell 24A and, thereby, the connector 10A (FIG. 10) disposed in an opening in the panel. Often, such panel-mounted connectors are mounted in "blind mating" environments and, consequently, flared flanges or lips 54 are provided about opening 36 in the shell in alignment with cavity 26 in the female housing thereby providing a self-aligning feature for a complementary mating device such as a mating connector.

Figure 11:
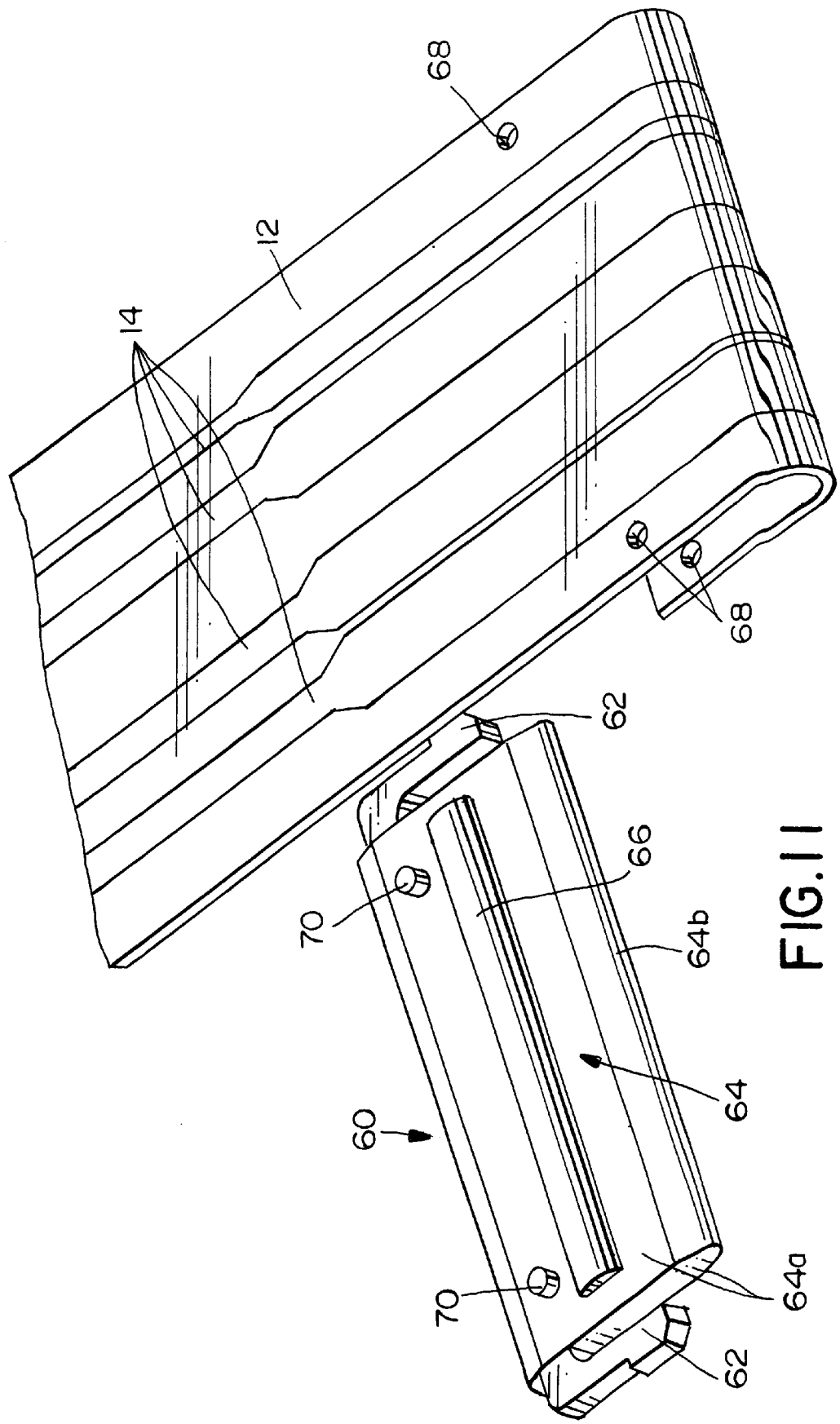
FIG. 11 is a perspective view of a male connector for terminating a flat flexible circuit, according to one embodiment of the invention wherein the yieldable backing member is a molded-in-place component.
Figure 12:
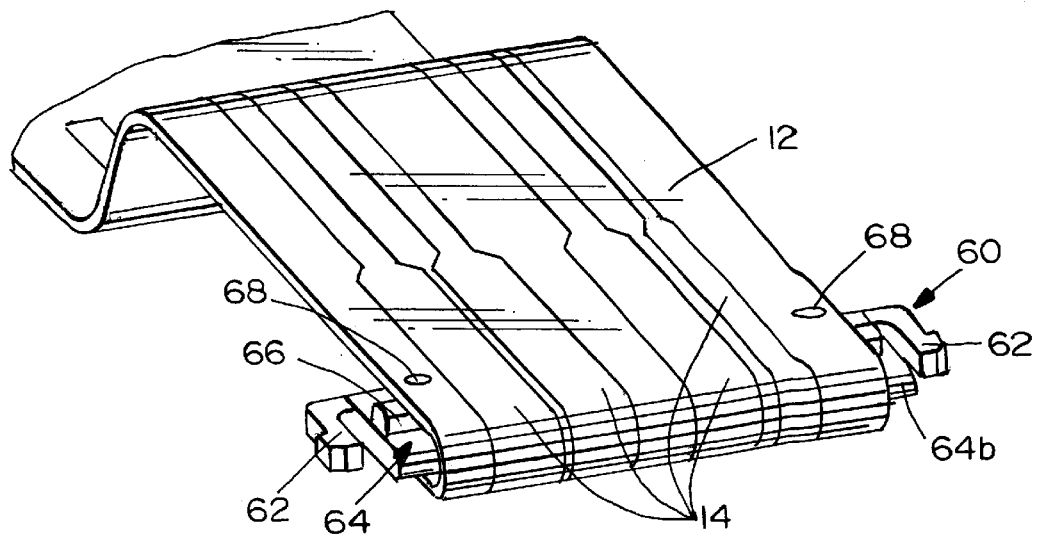
FIG. 12 is a perspective view of the connector of FIG. 11, with the flexible circuit terminated thereto.

FIGS. 11 and 12 show a male connector, generally designated 60, for electrically interconnecting conductors 14 of flat flexible cable 12 to the conductors of a complementary connecting device. For instance, the male connector may have hooked latch arms 62 at opposite ends thereof for latchingly engaging within latch openings 34 (FIGS. 1 and 2) in side walls 24c of shell 24 of female connector 10. The male connector would be properly sized for insertion through front opening 36 in the shell and into cavity 26 in female housing 22.

More particularly, male connector 60 has male body member, generally designated 64, defining opposite sides 64a and a front edge 64b. In the embodiment of FIGS. 11 and 12, a yieldable backing structure 66 is molded-in-place in a recess or indentation in one or both opposite sides 64a of body member 64. Similar to female housing 22 and yieldable backing structure 38 of female connector 10, male body member 64 can be molded of relatively rigid plastic material, and yieldable backing structure(s) 66 can be molded of elastomeric material, such as silicone rubber. The yieldable backing structure(s) can be either insert molded on the male body member, or the backing structure(s) and body member can be simultaneously molded as a "two-shot" injection process as described above.

In assembly of flexible circuit 12 to male connector 60, the flexible circuit is folded around front edge 64b of male body member 64 as shown in FIG. 12, with conductors 14 of the flexible circuit facing away from the body member. Positioning holes 68 are provided in the flexible circuit for press-fitting engagement with bosses 70 on opposite sides of body member 64 to position and provide strain relief for the flexible circuit wrapped about the male body member. Yieldable backing structure(s) 66, thereby, lie beneath the flexible circuit for resiliently biasing conductors 14 of the circuit against the conductors of the mating connecting device when the connector is mated with the device.

Figure 13:
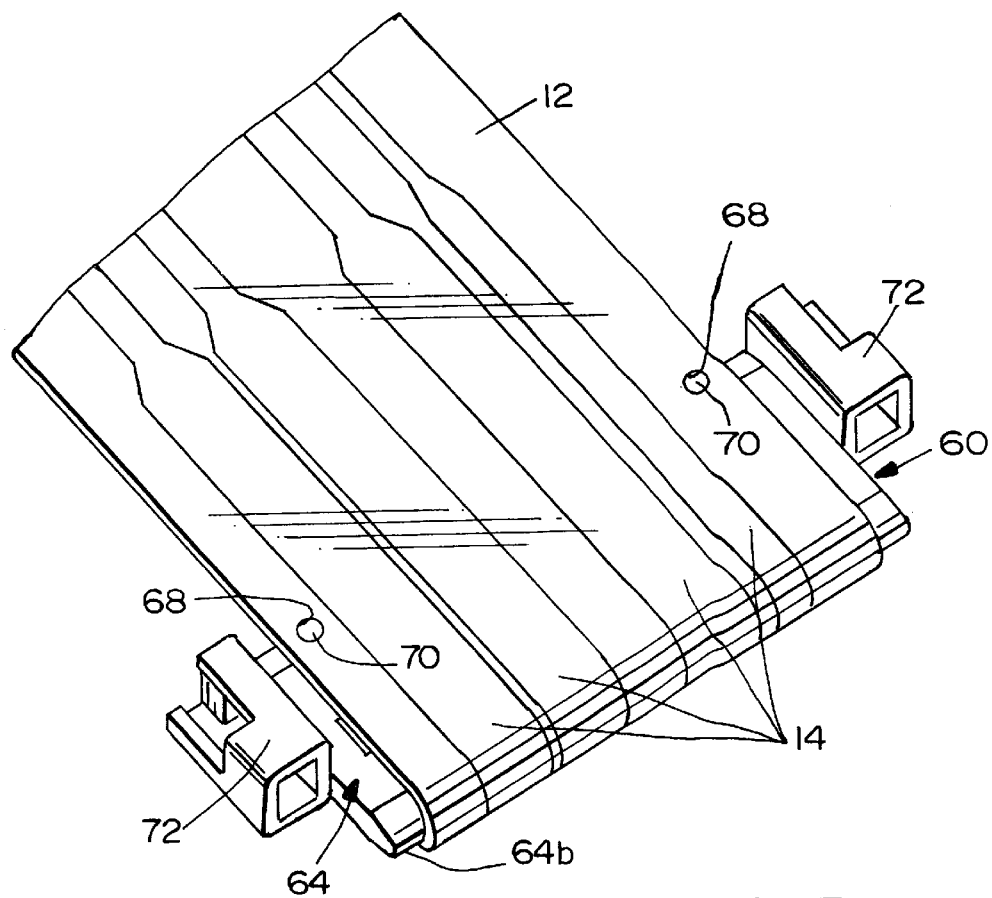
FIG. 13 is a view similar to that of FIG. 12, but with the latches of the connector of a different configuration.

FIG. 13 shows an alternate embodiment of a female latch structure 72 at each opposite end of male connector 60. These female latch structures may latchingly interengage with appropriate latches on a complementary female connecting device. On the other hand, it can be seen in FIG. 13 that female latches 72 are offset upwardly out of the plane of body member 64 to an extent that latch arms 62 (FIGS. 11 and 12) can be inserted thereinto to enable two separate male connectors to be intermated with the respective yielding backing structures 66 of the respective male connectors biasing the two respective flexible circuits toward each other to interengage their respective conductors.

Figure 14:
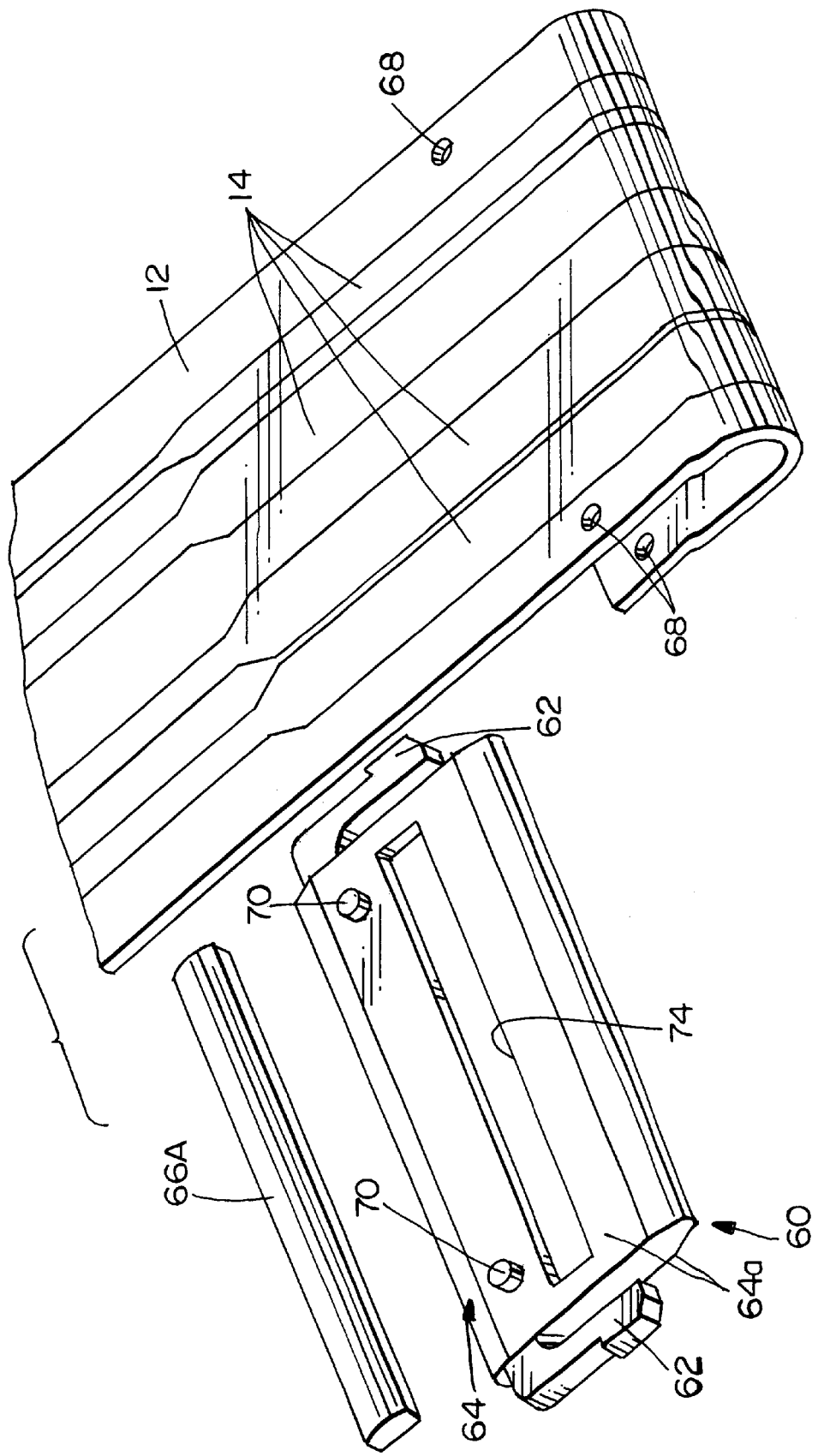
FIG. 14 is a view similar to that of FIG. 11, but with the yieldable backing structure being a separate component.

FIG. 14 is similar to FIG. 11, except that the male connector includes yieldable backing structures 66A which are molded separately from body member 64 and subsequently positioned within recesses 74 in one or both sides 64a of the body member. The yieldable backing structure(s) can be affixed within recesses 74.

Figure 15:
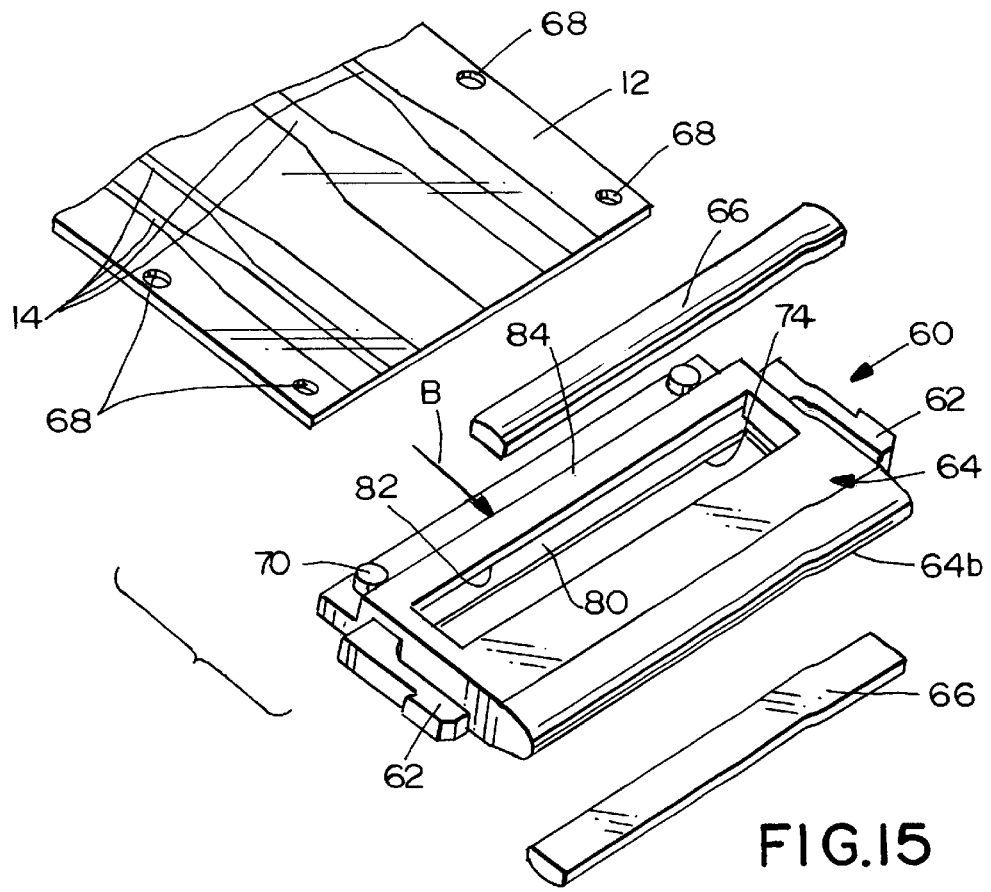
FIG. 15 is a view similar to that of FIG. 14, but with the male connector adapted as a double-sided connector.

FIG. 15 shows an embodiment of the male connector wherein a single-sided flexible circuit is terminated on both sides of the connector, that is, a redundant contact configuration. Unlike the embodiments shown in FIGS. 11 and 14, instead of wrapping around body member 64, the flexible circuit 12 is inserted in the direction of arrow "B" through slot 82 and beneath a top ledge 84. The flexible circuit then wraps around a configuration of stacked yieldable structures 66, and exits through a slot similar to 82 (not shown) on the bottom of body member 64. Each of the yieldable backing structures 66 is located in a recess 74 on opposite sides of an integrally molded sunken wall 80 and may be separately molded, as shown and as in FIG. 14, or molded-in-place, as in FIG. 11.

Figure 16:
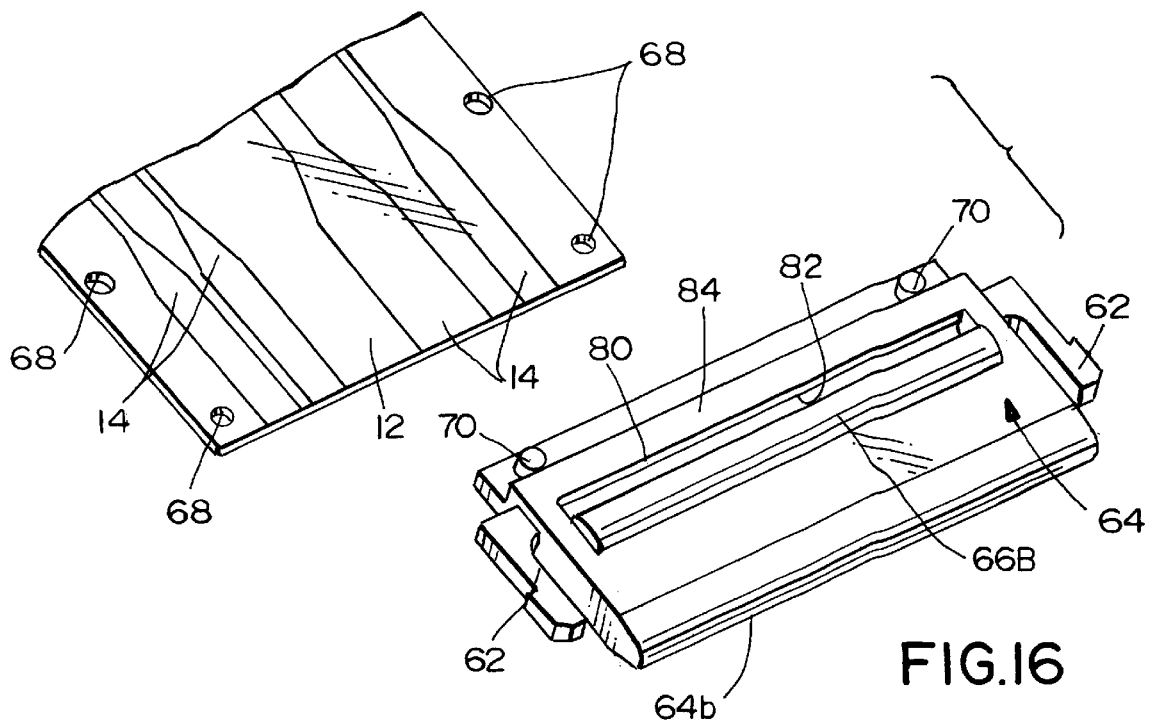
FIG. 16 is a view similar to that of FIG. 11, but with an alternate means of providing a flexible circuit strain relief by passing the flexible circuit through an integrally molded slot.

FIG. 16 shows an embodiment similar to that of FIG. 15, but backing structure 66B is shown as a bar molded unitarily with body member 64 of the male connector and wall 80 is the yieldable structure that provides the resilience for the relatively rigid backing structure that therefore allows the conductors of the flexible circuit to be biased against their respective conductors of the complementary mating connecting device.

Figure 17:
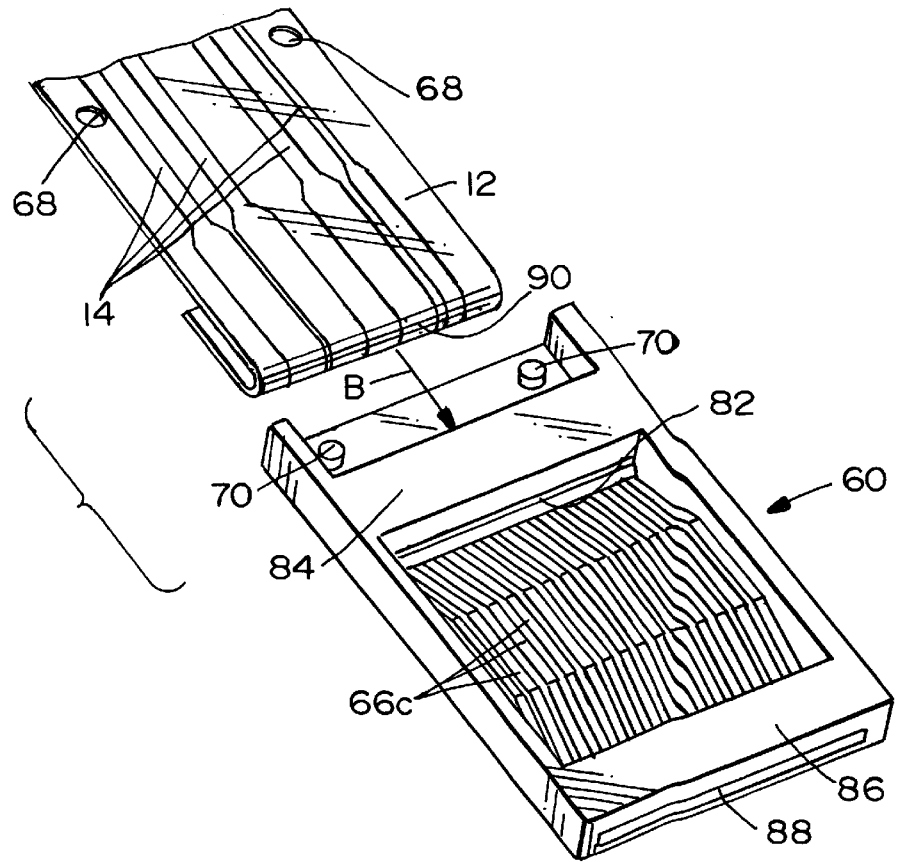
FIG. 17 is a view similar to that of FIG. 16, but with the yieldable backing structure being a plurality of integrally molded spring fingers.

FIG. 17 shows an embodiment of a male connector 60 wherein the flexible circuit again is inserted in the direction of arrow "B" through a slot 82 beneath a top ledge 84 similar to the embodiments of FIGS. 15 and 16. In this embodiment, the yieldable backing structure is provided by a plurality of flexible spring fingers 66C which engage the underside of the flexible circuit after it passes through slot 82. The flexible circuit passes under a front ledge 86 and out through a front slot 88 whereupon the flexible circuit is folded, as at 90, beneath the male connector.

Figure 18:
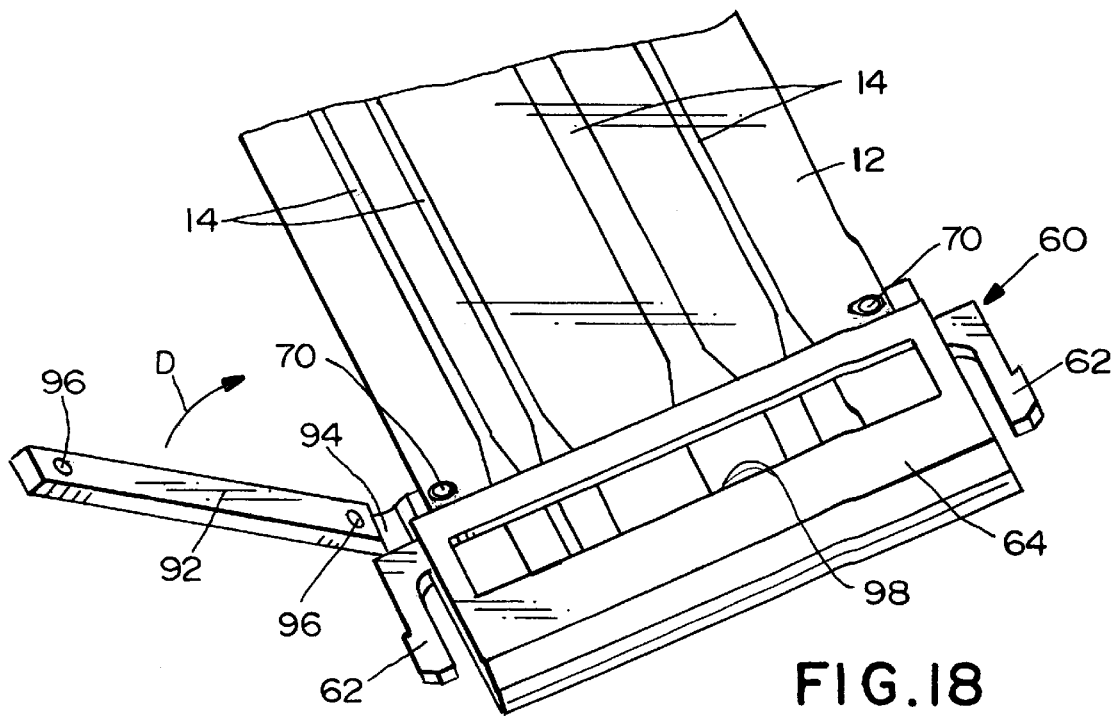
FIG. 18 is a perspective view of still a further embodiment of a male connector embodying a movable cable clamp.
Figure 19:
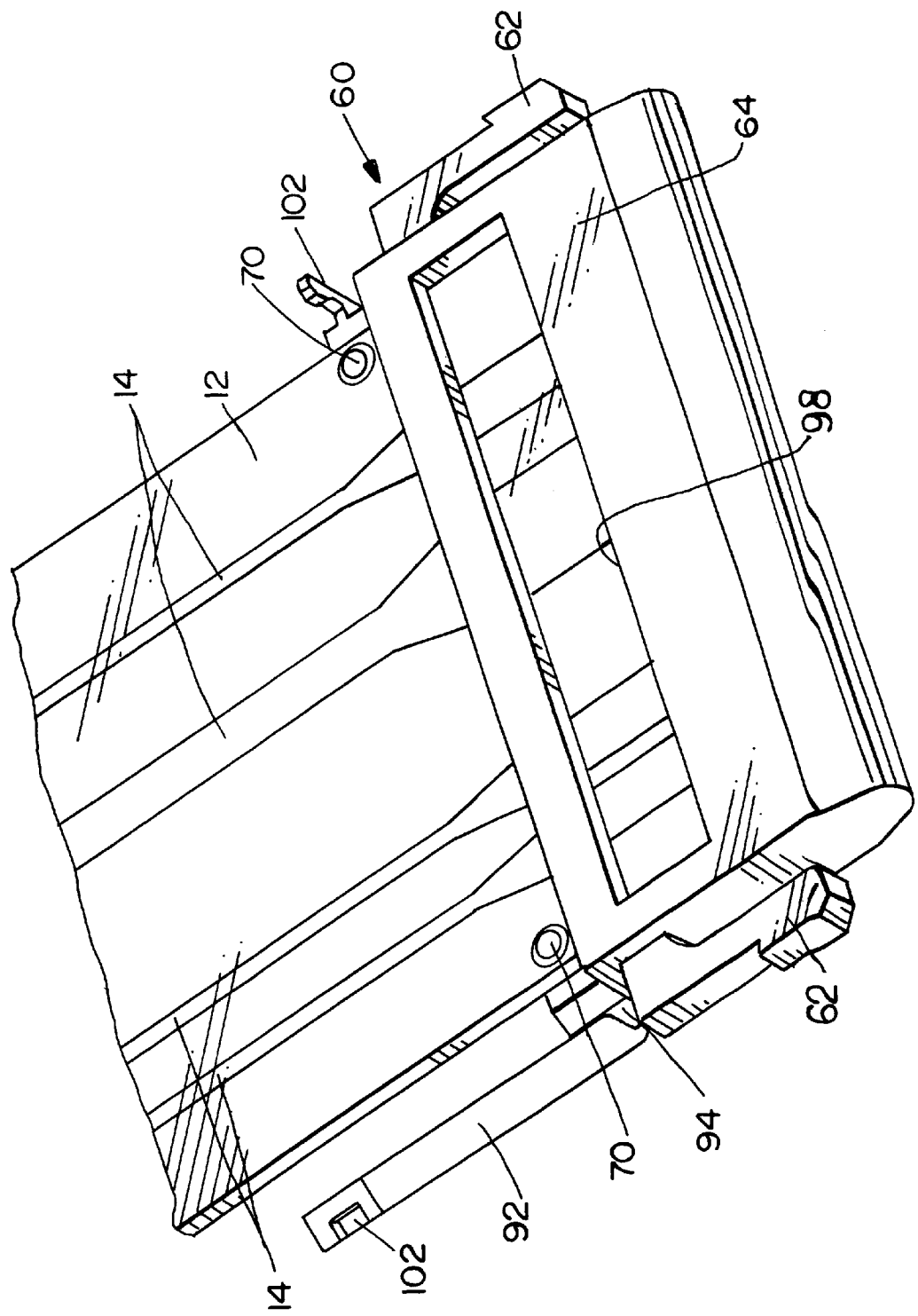
FIG. 19 is a perspective view of an embodiment of a male connector similar to that of FIG. 18 but with a movable cable clamp incorporating a latching mechanism.

FIG. 18 shows an embodiment of a male connector 60 which includes a clamp arm or bar 92 connected to body 64 by an integrally molded living hinge 94. The clamp arm is pivotal about the hinge in the direction of arrow "D" to clamp flexible circuit 12 against the connector and provide strain relief for the flexible circuit. Therefore if force is applied to the flexible circuit itself, the clamp arm will minimize the likelihood that the flexible circuit is pulled out of body member 64. Rather, the force will be imparted to the clamp arm or strain relief. The clamp arm has holes 96 which frictionally engage bosses 70 to hold the clamp arm in clamping position. FIG. 19 shows a similar connector 60 with a strain relief clamp arm which is provided with a latching mechanism to hold the strain relief in place by way of a releasable latching structure 102.

Connector 60 of FIGS. 18 and 19 also has a window 98 through which the flexible circuit is exposed for engaging the conductors of the complementary mating connecting device. If the flexible circuit utilized in the connector is double-sided, another window 98 would be similarly located on the underside of the connector so that a mating connector, or connectors, could contact both sides of the flex circuit. Connector 60 shown in FIGS. 18 and 19 does not include a yieldable backing structure, as evidenced by the recessed location of the flexible circuit within the window. Rather, the mating connector, such as the types disclosed in FIGS. 1–10, would include a yieldable backing structure to fit within the window or windows 98 to effect a connection with the flexible circuit.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

What is claimed is:

1. A female connector for electrically interconnecting conductors of a flat flexible circuit to conductors of a complementary mating connecting device, comprising:

a female housing having wall means defining a cavity for receiving the flexible circuit, the wall means including wall portions which are relatively movable between an open condition allowing a yieldable backing structure to be molded on a cavity-side of at least one of the wall portions and a closed condition defining said cavity, wherein said female housing is generally U-shaped and includes a pair of side wall portions defining opposite sides of the cavity and a rear wall portion defining a rear of the cavity, said rear wall portion including a slot through which the flat flexible circuit passes; and a yieldable molded-in-place backing structure on said cavity-side of the at least one wall portion for resiliently biasing the conductors of the flexible circuit received in the cavity against the conductors of the mating connecting device when the connector is mated with the device.

2. The female connector of claim 1 wherein said female housing is molded of plastic material and said wall portions are joined by an integrally molded living hinge to provide for said relative movement of the wall portions.

3. The female connector of claim 1, including at least one of said yieldable molded-in-place backing structures on the cavity-side of each of said side wall portions.

4. The female connector of claim 1, including a generally rigid outer shell substantially surrounding the female housing and having an opening aligned with the cavity.

5. The female connector of claim 1 wherein said female housing is molded of plastic material and said side wall portions are joined to the rear wall portion by integrally molded living hinges to provide for said relative movement of the wall portions.

6. The female connector of claim 1, including a generally rigid outer shell substantially surrounding the female housing and having an opening aligned with the cavity.

7. The female connector of claim 1, including latch means operatively associated between said relatively movable wall portions to hold the wall portions in their closed condition.

8. The female connector of claim 1 wherein said female housing includes end wall portions cooperating with said side wall portions and rear wall portion to define a box-shaped structure with a front opening for receiving the flexible circuit.

9. The female connector of claim 8, including latch means operatively associate between at least some of said wall portions to hold all the wall portions in their box-shaped configuration.

10. The female connector of claim 9 wherein said female housing is molded of plastic material and said side wall portions are joined to the rear wall portion and said end wall portions are joined to said side wall portions by integrally molded living hinges to provide for said relative movement of the wall portions.

11. The female connector of claim 10, including latch means operative associated between said end wall portions and said side wall portions to hold all the wall portions in their box-shaped configuration.

12. A female connector for electrically interconnecting conductors of a flat flexible circuit to conductors of a complementary mating connecting device, comprising:

a female housing having wall portions defining a cavity for receiving the flexible circuit, with the wall portions being relatively movable between an open condition allowing a yieldable backing structure to be assembled on a cavity-side of at least one of the wall portions and a closed condition defining said cavity, wherein said female housing is generally U-shaped and includes a pair of side wall portions defining opposite sides of the cavity and a rear wall portion defining a rear of the cavity, said rear wall portion including a slot through which the flat flexible circuit passes; and a yieldable backing structure on said cavity-side of the at least one wall portion for resiliently biasing the conductors of the flexible circuit received in the cavity against the conductors of the mating connecting device when the connector is mated with the device.

13. The female connector of claim 12 wherein said female housing is molded of plastic material and said wall portions are joined by an integrally molded living hinge to provide for said relative movement of the wall portions.

14. The female connector of claim 12, including at least one of said yieldable backing structures on the cavity-side of each of said side wall portions.

15. The female connector of claim 12, including a generally rigid outer shell substantially surrounding the female housing and having an opening aligned with the cavity.

16. The female connector of claim 12 wherein said female housing is molded of plastic material and said side wall portions are joined to the rear wall portion by integrally molded living hinges to provide for said relative movement of the wall portions.

17. The female connector of claim 12, including a generally rigid outer shell substantially surrounding the female housing and having an opening aligned with the cavity.

18. The female connector of claim 12, including latch means operatively associated between said relatively movable wall portions to hold the wall portions in their closed condition.

19. The female connector of claim 15 wherein said female housing includes end wall portions cooperating with said side wall portions and rear wall portion to define a box-shaped structure with a front opening for receiving the flexible circuit.

20. The female connector of claim 19, including latch means operatively associated between at least some of said wall portions to hold all the wall portions in their box-shaped configuration.

21. A female connector for electrically interconnecting conductors of a flat flexible circuit to conductors of a complementary mating connecting device, comprising:

a female housing having wall portions defining a cavity for receiving the flexible circuit wherein said female housing is generally U-shaped and includes a pair of side wall portions defining opposite sides of the cavity and a rear wall portion defining a rear of the cavity, said rear portion including a slot through which the flat flexible circuit passes; and a yieldable molded-in-place backing structure on a cavity-side of at least one of the wall portions for resiliently biasing the conductors of the flexible circuit received in the cavity against the conductors of the mating connecting device when the connector is mated with the device.

22. The female connector of claim 21, including at least one of said yieldable molded-in-place backing structures on the cavity-side of each of said side wall portions.

23. The female connector of claim 21, including a generally rigid outer shell substantially surrounding the female housing and having an opening aligned with the cavity.

24. The female connector of claim 21 wherein said female housing includes end wall portions cooperating with said side wall portions and rear wall portion to define a box-shaped structure with a front opening for receiving the flexible circuit.

25. A connector assembly for electrically interconnecting conductors of a flat flexible circuit to conductors of a complementary mating connecting device, comprising:

a female connector including a female housing having wall means defining a cavity for receiving the flexible circuit, the wall means including wall portions which are relatively movable between an open condition allowing a yieldable backing structure to be molded on a cavity-side of at least one of the wall portions and a closed condition defining said cavity, and a yieldable molded-in-place backing structure on said cavity-side of the at least one wall portion for resiliently biasing the conductors of the flexible circuit received in the cavity against the conductors of the mating connecting device when the connector is mated with the device; and a male connector mounting a second flat flexible circuit, the male connector being adapted for insertion into the cavity of the female connector and engaging conductors of the second flat flexible circuit with the conductors of the flexible circuit received in said cavity.

26. A connector assembly for electrically interconnecting conductors of a flat flexible circuit to conductors of a complementary mating connecting device, comprising:

a female connector including a female housing having wall portions defining a cavity for receiving the flexible circuit, with the wall portions being relatively movable between an open condition allowing a yieldable backing structure to be assembled on a cavity-side of at least one of the wall portions and a closed condition defining said cavity, and a yieldable backing structure on said cavity-side of the at least one wall portion for resiliently biasing the conductors of the flexible circuit received in the cavity against the conductors of the mating connecting device when the connector is mated with the device; and a male connector mounting a second flat flexible circuit, the male connector being adapted for insertion into the cavity of the female connector and engaging conductors of the second flat flexible circuit with the conductors of the flexible circuit received in said cavity.

27. A connector assembly for electrically interconnecting conductors of a flat flexible circuit to conductors of a complementary mating connecting device, comprising:

a female connector including a female housing having wall portions defining a cavity for receiving the flexible circuit and a yieldable molded-in-place backing structure on a cavity-side of at least one of the wall portions for resiliently biasing the conductors of the flexible circuit received in the cavity against the conductors of the mating connecting device when the connector is mated with the device; and a male connector mounting a second flat flexible circuit, the male connector being adapted for insertion into the cavity of the female connector and engaging conductors of the second flat flexible circuit with the conductors of the flexible circuit received in said cavity.

* * * * *